United States Patent
Hekmatshoar-Tabari et al.

(10) Patent No.: US 10,050,166 B2
(45) Date of Patent: Aug. 14, 2018

(54) SILICON HETEROJUNCTION PHOTOVOLTAIC DEVICE WITH WIDE BAND GAP EMITTER

(71) Applicant: International Business Machines Corporation, Armonk, NY (US)

(72) Inventors: Bahman Hekmatshoar-Tabari, White Plains, NY (US); Ali Khakifirooz, Los Altos, CA (US); Devendra K. Sadana, Pleasantville, NY (US); Ghavam G. Shahidi, Pound Ridge, NY (US); Davood Shahrjerdi, Brooklyn, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/648,238

(22) Filed: Jul. 12, 2017

(65) Prior Publication Data
US 2017/0309768 A1    Oct. 26, 2017

Related U.S. Application Data

(60) Continuation of application No. 15/179,682, filed on Jun. 10, 2016, now Pat. No. 9,716,201, which is a (Continued)

(51) Int. Cl.
*H01L 31/18*   (2006.01)
*H01L 31/0336*   (2006.01)
(Continued)

(52) U.S. Cl.
CPC ........ *H01L 31/074* (2013.01); *H01L 21/0254* (2013.01); *H01L 21/02381* (2013.01);
(Continued)

(58) Field of Classification Search
CPC .................................................. H01L 31/1852
See application file for complete search history.

(56) References Cited

U.S. PATENT DOCUMENTS

| 4,365,107 | A | 12/1982 | Yamauchi |
| 6,372,981 | B1 * | 4/2002 | Ueda .................. C30B 25/02 |
| | | | 117/101 |

(Continued)

FOREIGN PATENT DOCUMENTS

JP    S61-188975 A1    8/1986

OTHER PUBLICATIONS

Muñoz, D., et al. "Optimization of KOH etching process to obtain textured substrates suitable for heterojunction solar cells fabricated by HWCVD." Thin Solid Films 517.12 (2009): 3578-3580.*

(Continued)

*Primary Examiner* — Victor A Mandala
*Assistant Examiner* — Regan J Rundio
(74) *Attorney, Agent, or Firm* — Scully, Scott, Murphy & Presser, P.C.; Louis J. Percello, Esq.

(57) ABSTRACT

A photovoltaic device including a single junction solar cell provided by an absorption layer of a type IV semiconductor material having a first conductivity, and an emitter layer of a type III-V semiconductor material having a second conductivity, wherein the type III-V semiconductor material has a thickness that is no greater than 50 nm.

17 Claims, 5 Drawing Sheets

Related U.S. Application Data continuation of application No. 14/662,597, filed on Mar. 19, 2015, now Pat. No. 9,373,743, which is a division of application No. 13/290,404, filed on Nov. 7, 2011, now Pat. No. 9,018,517.

(51) Int. Cl.

| | | |
|---|---|---|
| *H01L 31/074* | (2012.01) | |
| *H01L 31/0304* | (2006.01) | |
| *H01L 31/072* | (2012.01) | |
| *H01L 31/036* | (2006.01) | |
| *H01L 31/0236* | (2006.01) | |
| *H01L 21/02* | (2006.01) | |
| *H01L 21/265* | (2006.01) | |
| *H01L 31/0216* | (2014.01) | |
| *H01L 31/0224* | (2006.01) | |
| *H01L 31/068* | (2012.01) | |

(52) U.S. Cl.
CPC .. *H01L 21/02458* (2013.01); *H01L 21/02461* (2013.01); *H01L 21/02463* (2013.01); *H01L 21/02466* (2013.01); *H01L 21/02543* (2013.01); *H01L 21/02546* (2013.01); *H01L 21/02549* (2013.01); *H01L 21/26513* (2013.01); *H01L 31/02167* (2013.01); *H01L 31/02363* (2013.01); *H01L 31/02366* (2013.01); *H01L 31/022425* (2013.01); *H01L 31/022441* (2013.01); *H01L 31/022466* (2013.01); *H01L 31/036* (2013.01); *H01L 31/0336* (2013.01); *H01L 31/03044* (2013.01); *H01L 31/03048* (2013.01); *H01L 31/072* (2013.01); *H01L 31/18* (2013.01); *H01L 31/1852* (2013.01); *H01L 31/1868* (2013.01); *H01L 31/1884* (2013.01); *H01L 31/0682* (2013.01); *Y02E 10/544* (2013.01)

(56) References Cited

U.S. PATENT DOCUMENTS

| | | | |
|---|---|---|---|
| 7,199,395 B2 | 4/2007 | Terakawa et al. | |
| 7,872,252 B2 | 1/2011 | Puetz et al. | |
| 8,124,958 B2 | 2/2012 | Puetz et al. | |
| 8,164,092 B2 | 4/2012 | Tiwari et al. | |
| 8,288,196 B2 | 10/2012 | Ducros et al. | |
| 9,018,517 B2 | 4/2015 | Hekmatshoar-Tabari et al. | |
| 9,412,894 B2 | 8/2016 | Song et al. | |
| 2004/0103937 A1 | 6/2004 | Bilyalov et al. | |
| 2004/0112426 A1* | 6/2004 | Hagino | H01L 31/02242 136/261 |
| 2007/0137698 A1 | 6/2007 | Wanlass et al. | |
| 2008/0156370 A1 | 7/2008 | Abdallah et al. | |
| 2008/0290368 A1* | 11/2008 | Rubin | H01L 31/02167 257/184 |
| 2008/0314447 A1* | 12/2008 | Walukiewicz | H01L 31/0725 136/261 |
| 2009/0056800 A1 | 3/2009 | Ulyashin et al. | |
| 2009/0173379 A1 | 7/2009 | Kim | |
| 2009/0250108 A1 | 10/2009 | Zhou et al. | |
| 2009/0293948 A1 | 12/2009 | Tucci et al. | |
| 2010/0087030 A1* | 4/2010 | Kim | H01L 31/1804 438/71 |
| 2010/0108134 A1 | 5/2010 | Ravi | |
| 2010/0263722 A1 | 10/2010 | Kubo et al. | |
| 2011/0036402 A1 | 2/2011 | Ishihara et al. | |
| 2011/0303280 A1 | 12/2011 | Pawlak et al. | |
| 2012/0073658 A1* | 3/2012 | Tomita | H01L 31/0725 136/261 |
| 2012/0080082 A1 | 4/2012 | Suh | |
| 2012/0080092 A1 | 4/2012 | Singh et al. | |
| 2012/0199202 A1 | 8/2012 | Prajapati | |
| 2012/0211079 A1 | 8/2012 | Hekmatshoar-Tabari et al. | |
| 2012/0235116 A1* | 9/2012 | Su | H01L 33/06 257/13 |
| 2013/0014813 A1 | 1/2013 | Wang et al. | |
| 2013/0025653 A1 | 1/2013 | Bedell et al. | |
| 2013/0034924 A1 | 2/2013 | Lochtefeld | |
| 2013/0153013 A1 | 6/2013 | Archer et al. | |

OTHER PUBLICATIONS

Aberle, A. G., "Surface Passivation of Crystalline Silicon Solar Cells: A Review", Progress in Photovoltaics Research and Applications, Revised May 23, 2000, Prog. Photovolt.: Res. Appl. 8, pp. 473-487.

Wang, G., et al., "Surface and bulk passivation of GaAs solar cell on Si substrate by H2+PH3 plasma", Applied Physics Letters, Feb. 7, 2000, vol. 76, No. 6, pp. 730-732.

Ehling, C., et al., "a-SiC:H passivation for crystalline silicon solar cells", Phys. Status Solidi C, 7, Feb. 23, 2010, No. 3-4, pp. 1016-1020.

Ringel, "Hydrogen-Extended Defect Interactions in Heteroepitaxial InP Materials and Devices", Solid-State Electronics, 1997, vol. 41, No. 3, pp. 359-380.

Dekkers, et al., "Silicon surface texturing by reactive ion etching", Optoelectronics review 4 (2000): pp. 311-316.

List of IBM Patents or Patent Applications Treated As Related Dated Jul. 12, 2017, 2 Pages.

* cited by examiner

SILICON HETEROJUNCTION PHOTOVOLTAIC DEVICE WITH WIDE BAND GAP EMITTER

BACKGROUND

The present disclosure relates to photovoltaic devices, and more particularly to photovoltaic devices such as, for example, solar cells.

A photovoltaic device is a device that converts the energy of incident photons to electromotive force (e.m.f.). Typical photovoltaic devices include solar cells, which are configured to convert the energy in the electromagnetic radiation from the sun to electric energy. Multi-junction solar cells comprising compound semiconductors may be employed for power generation in space due to their high efficiency and radiation stability.

SUMMARY

In one embodiment, a photovoltaic device is provided that includes a single junction solar cell provided by an absorption layer of a type IV semiconductor material having a first conductivity type, and an emitter layer of a type III-V semiconductor material having a second conductivity type, wherein the type III-V semiconductor material has a thickness that is no greater than 50 nm.

In another aspect, a method of forming a photovoltaic device is provided, in which the photovoltaic device is a single junction solar cell provided by an emitter layer of a first conductivity type III-V semiconductor material, and an absorption layer of a second conductivity type IV semiconductor material. In one embodiment, the method may include providing an absorption layer of a crystalline type IV semiconductor material having a first conductivity, and epitaxially forming an emitter layer of a crystalline type III-V semiconductor material having a second conductivity on a surface of the absorption layer.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
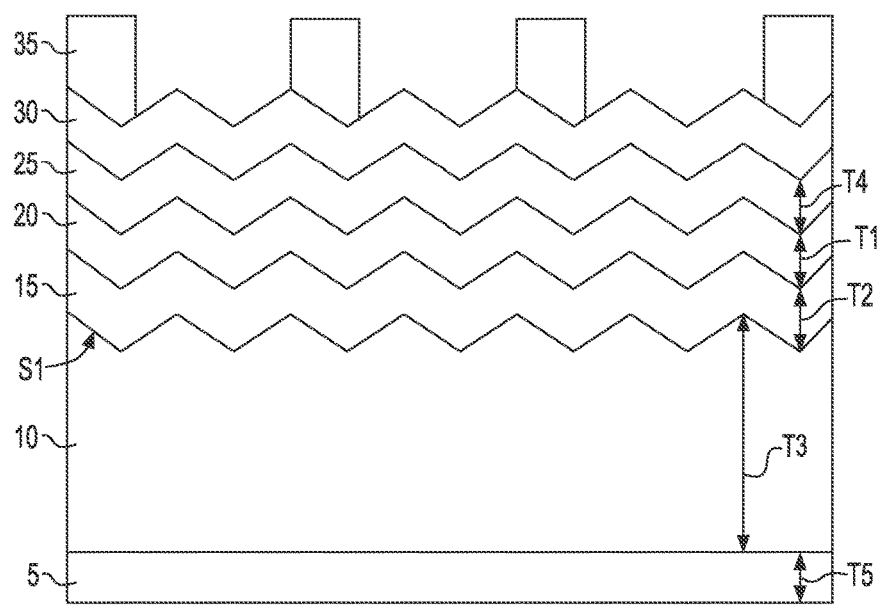
FIG. 1 is a side cross-sectional view of single junction solar cell provided by an absorption layer of a type IV semiconductor material and an emitter layer of a type III-V semiconductor material, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides a single junction photovoltaic device, such as a solar cell, and a method of forming the same. As used herein, a "photovoltaic device" is a device, such as a solar cell, that produces free electrons and/or vacancies, i.e., holes, when exposed to radiation, such as light, and results in the production of an electric current. A single junction photovoltaic device typically includes a semiconductor layer of a p-type conductivity that shares an interface with a semiconductor layer of an n-type conductivity, in which the interface provides an electrical junction. If the n-type and p-type regions are comprised of two different semiconductor materials, i.e., of different composition and/or crystalline structures, the junction is referred to as a heterojunction. The single junction photovoltaic device may include an emitter layer of a type III-V semiconductor material and an absorption layer that is composed of a type IV semiconductor material. The type III-V semiconductor materials are compound semiconductors composed of elements from groups III and V of the Periodic Table of Elements. A type IV semiconductor material is a semiconductor material selected from group IV of the Periodic Table of Elements.

Some type III-V semiconductor materials are of interest for photovoltaic devices for their wide bandgap electrical properties when formed on type IV semiconductor materials, in which type IV semiconductor material have a lesser bandgap value. For example, silicon (Si) is a type IV semiconductor material having a bandgap of 1.1 eV, whereas a type III-V semiconductor, such as gallium nitride (GaN), has a bandgap of 3.3 eV. Type III-V semiconductor materials are of interest for photovoltaic devices because the presence of two or more different bandgaps allows the more efficient collection of the solar spectrum, i.e., photons with shorter wavelengths are effectively collected in the top cells, and photons having longer wavelengths are effectively collected in the bottom cells. As a result, the output voltage, and/or current of the solar cell is improved with an appropriate cell design. However, the low efficiency of multi-junction, e.g., tandem (dual-junction), photovoltaic devices including at least a top cell composed of a type III-V semiconductor material and a bottom cell composed of a type IV semiconductor material have limited the advantages of type III-V semiconductor materials. It has been determined that the low efficiencies measured from multi-junction photovoltaic devices including a top cell composed of type III-V semiconductor materials results from the poor epitaxial growth of type III-V semiconductor materials, such as gallium nitride, on the silicon of the underlying cell. The poor epitaxial growth of the III-V semiconductor materials causes a high density of structural defects in the cell of the photovoltaic device that is composed of the type III-V semiconductor material. As a result, the carrier lifetime in the type III-V semiconductor material and therefore the efficiency of the cell including the type III-V semiconductor material is degraded.

In one embodiment, the present disclosure takes advantage of the wide bandgap properties of type III-V semiconductor materials by using a single junction photovoltaic device, in which the emitter layer of the single junction photovoltaic device is composed of a type III-V semiconductor material having a thickness of 50 nm or less, e.g., 10 nm or less, and the absorption layer of the single junction photovoltaic device is composed of a type IV semiconductor material instead of using a multi-junction photovoltaic device. This is because carrier collection through the III-V emitter layer is dominated by tunneling rather than diffusion, as a result of the thin thickness of the III-V emitter layer. As used herein, the term "single junction" denotes that the photovoltaic device only includes one p-n junction. A "p-n junction" is an interface between a first material having a p-type conductivity, such as a p-type emitter layer, and a second material having an n-type conductivity, such as an n-type absorption layer. In contrast to a single junction photovoltaic device, a multi-junction photovoltaic device is composed of multiple p-n junctions.

Compared to a solar cell including an emitter layer composed of a type IV semiconductor material, the type III-V semiconductor material emitter layer of the structures and methods disclosed herein may improve the performance of the disclosed single junction solar cell in at least one of the following ways. For an n-type emitter layer of a type III-V semiconductor material, the lower electron affinity of the type III-V semiconductor material of the emitter layer compared to that of the absorption layer of the type IV semiconductor material may increase the splitting of the quasi-Fermi levels for electrons and holes at the emitter layer (by raising the quasi-Fermi level for electrons), and therefore increase the open circuit voltage of the cell. Similarly, for a p-type emitter layer of a type III-V semiconductor material, the higher hole affinity of the type III-V semiconductor material compared to that of the absorption layer of the type IV semiconductor material may increase the splitting of the quasi-Fermi levels for electrons and holes (by lowering the quasi-Fermi level for holes) at the emitter layer, and therefore increase the open circuit voltage of the cell. The hole affinity of a material is defined as the sum of the bandgap and the electron affinity of that material.

In another embodiment, for an n-type emitter layer of a type III-V semiconductor material, the larger hole affinity of the type III-V semiconductor material of the emitter layer compared to that of the type IV semiconductor material of the absorption layer increases the potential barrier for hole tunneling through the emitter layer junction, and therefore reduces the dark current of the solar cell. As a result, the open circuit voltage of the solar cell is increased. Similarly, for a p-type emitter layer of a type III-V semiconductor material, the smaller electron affinity of the type III-V semiconductor material compared to that of the absorption layer of the type IV semiconductor material increases the potential barrier for electron tunneling through the emitter layer junction, and therefore reduces the dark current of the solar cell, resulting in a higher open circuit voltage.

In another embodiment, the enhanced electric field at the emitter layer due to the lower electron affinity of the type III-V semiconductor material compared to that of the type IV semiconductor material of the absorption layer improves carrier separation at the emitter layer, and therefore the short circuit current of the solar cell.

In an even further embodiment, in comparison to an emitter layer composed of a type IV semiconductor material, the wide bandgap of the emitter layer of the type III-V semiconductor material reduces absorption loss within the emitter layer, particularly at short wavelengths. Therefore, in comparison to an emitter layer composed of a type IV semiconductor material, the wide bandgap of the type III-V semiconductor material increases the short circuit current of the solar cell including the emitter layer of the type III-V semiconductor material. Each of the aforementioned embodiments and advantages described may be provided singularly or in combination.

FIG. 1 depicts one embodiment of a single junction solar cell provided by an absorption layer 10 (also referred to as an absorber 10) of a type IV semiconductor material and an emitter layer 20 (also referred to as emitter 20) of a type III-V semiconductor material. The "absorption layer" of the photovoltaic device is the material that readily absorbs photons to generate charge carriers, i.e., free electrons or holes. A portion of the photovoltaic device, between the front side and the junction with the absorption layer 10 is referred to as the "emitter layer", and the junction is referred to as the "emitter layer junction". The emitter layer 20 may be present atop the absorption layer 10, in which the emitter layer 20 has a conductivity type that is opposite the conductivity type of the absorption layer 10. As used herein, the term "conductivity type" denotes a semiconductor material being p-type or n-type. As used herein, "p-type" refers to the addition of impurities to an intrinsic semiconductor that creates deficiencies of valence electrons (i.e. holes). As used herein, "n-type" refers to the addition of impurities that contributes free electrons to an intrinsic semiconductor.

In one example, when the sun's energy in the form of photons collects in the cell layers, electron-hole pairs are generated in the n-type and p-type conductivity materials within the photovoltaic device. The emitter layer junction provides the required electric field for the collection of the photo-generated electrons and holes on the p-type doped and n-type doped sides of the emitter layer junction, respectively. For this reason, and in this example, at least one p-type layer of the photovoltaic device may provide the absorption layer 10, and at least one adjacent n-type layer may provide the emitter layer 20.

In one embodiment, the emitter layer 20 is comprised of at least one type III-V semiconductor material selected from the group consisting of gallium nitride (GaN), gallium phosphorus nitride (GaPN), aluminum antimonide (AlSb), aluminum arsenide (AlAs), aluminum nitride (AlN), aluminum phosphide (AlP), boron nitride (BN), boron phosphide (BP), boron arsenide (BAs), gallium arsenide (GaAs), gallium phosphide (GaP), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. In one example, the emitter layer 20 is comprised of at least one type III-V semiconductor material selected from the group consisting of gallium nitride (GaN), indium gallium nitride (InGaN), gallium phosphide (GaP), indium phosphide (InP), gallium phosphide nitride (GaPN), gallium antimony nitride (GaSbN), gallium arsenide phosphorous nitride (GaAsPN), and combinations thereof. In yet another example, the emitter layer 20 is comprised of GaN, InGaN, GaP, InP and/or GaPN.

It is noted that the aforementioned type III-V semiconductor materials for the emitter layer 20 are provided for illustrative purposes only, as other type III-V semiconductor materials can also be employed, so long as the electron affinity of the type III-V semiconductor material is lower than the electron affinity of the type IV semiconductor material, and/or the hole affinity of the type III-V semiconductor material is higher than that of the type IV semiconductor material. The electron and hole affinities of crystalline silicon are approximately 4.05 eV and 5.15 eV, respectively, in which the hole affinity is defined as the sum of the electron affinity and the bandgap. The electron and hole affinities of crystalline germanium are approximately 4.00 eV and 4.67 eV, respectively. For a $Si_xGe_{1-x}$ alloy, the electron and hole affinities have a linear dependence of the composition ratio, x. For example, when x=0.75, the electron and hole affinities are approximately, 4.04 eV and 5.03 eV, respectively. In another example when x=0.50, the electron and hole affinities are approximately 4.03 eV and 4.91 eV, respectively. The composition ratio may be constant or vary across the absorption layer. In the above examples, x refers to the composition ratio at the top surface of the absorption layer 10, i.e., at the emitter layer junction.

Each of the III-V semiconductor materials that provide the emitter layer 20 may have a single crystal, multi-crystal or polycrystalline crystal structure. The term "single crystal crystalline structure" denotes a crystalline solid, in which the crystal lattice of the entire sample is substantially continuous and substantially unbroken to the edges of the sample, with substantially no grain boundaries. The crystalline material may contain structural defects due to non-ideal growth. In another embodiment, the crystalline semiconductor material of the emitter layer 20 is of a polycrystalline structure. Contrary to a single crystal crystalline structure, a polycrystalline or multi-crystalline structure is a form of semiconductor material made up of randomly oriented crystallites and containing large-angle grain boundaries, twin boundaries or both. Each of the type III-V semiconductor materials that provide the emitter layer 20 may be an epitaxially formed layer. The terms "epitaxially formed", "epitaxial growth" and/or "epitaxial deposition" means the growth of a semiconductor material on a deposition surface of a semiconductor material, in which the crystal orientation of the semiconductor material being grown is determined by that of the semiconductor material of the deposition surface, i.e. substrate. In other words, there is one or more preferred orientations of the layer being grown with respect to that of the substrate. Typically, epitaxial growth conditions and substrate orientation are chosen to result in one well-defined crystal orientation, i.e. single-domain epitaxial growth. Due to the lattice mismatch (i.e. difference in lattice constants) of the epitaxial layer being grown and the semiconductor material of the growth surface, the epitaxial growth may deviate from ideal growth resulting in crystal imperfections, i.e., structural defects such as dislocations or stacking faults may be present in the epitaxially grown material. This is because the lattice mismatch creates mechanical strain in the lattice of the epitaxially grown material, which may be relaxed (typically in part) by the formation of crystal defects. Since the level of strain is typically accumulated by increasing the thickness of the layer being grown, the chance of defect creation is also increased by increasing the thickness of the layer being grown. Excessive strain may disrupt the epitaxial growth or result in the cracking of the layer being grown. Therefore, the growth of the thin III-V layers required for the disclosed devices is typically less demanding (in terms of controlling the strain and defect formation)

compared to the growth of thick III-V materials required for conventional multi-junction devices. In some embodiments, this is an additional advantage of the disclosed structure. Typically, the (111) surface of IV material substrate such as Si (which has a cubic crystal structure) is chosen for epitaxial growth of III-V materials. This is because the hexagonal arrangement of atoms in the (111) plane of IV materials facilitates the growth of III-V materials. However, as known in the art, other planes such as (100) and (110) may be also used as the growth surface. A typical example is the growth of hexagonal GaN (0001) on Si (111). In some embodiments where hexagonal (0001) III-V materials such as GaN are grown epitaxially on the (111) terminated surface of textured Si (100) containing substrates, cubic III-V material may grow at locations where two hexagonal III-V growth surfaces intersect due to the geometry of the texture.

The emitter layer 20 may be composed of a single layer of type III-V semiconductor material, or may be a multi-layered structure of type III-V semiconductor material. The emitter layer 20 typically has a total thickness T1 that is no greater than 50 nm. In one embodiment, the total thickness T1 of the emitter layer 20 is no greater than 10 nm. In another embodiment, the total thickness T1 of the emitter layer 20 may range from 1 nm to 8 nm. In a further embodiment, the total thickness T1 of the emitter layer 20 may range from 3 nm to 5 nm. The thickness of the emitter layer 20 may be selected so that the majority of the photo-generated charge carriers tunnel through the emitter layer 20 (as well as through the passivation/buffer layers 15 and 25 if present), and are transferred toward the emitter electrode 35. As used herein, the term "tunneling" means the quantum-mechanical transport of a charge carrier, i.e., electron and/or hole charge carrier, across a potential energy barrier, such as the potential barrier at the p-n junction, without changing its energy. Because the thickness of the emitter layer 20 is 50 nm or less, e.g., less than 10 nm, and the charge carriers tunnel through the emitter layer 20, the requirement on the high crystalline quality of the epitaxially grown emitter layer 20 is significantly reduced. A high quality crystalline semiconductor material layer typically has a defect density that is less than $10^{13}$ defects/cm$^3$. This typically requires a dislocation density of lower than $10^8$ dislocations/cm$^2$ in the epitaxially grown material. In one embodiment, a single junction solar cell formed in accordance with the present disclosure having an emitter layer 20 with a thickness of 10 nm or less, and being composed of a type III-V semiconductor material with a defect density ranging from $10^{13}$ defects/cm$^3$ to $10^{19}$ defects/cm$^3$.

To provide a junction between the emitter layer 20 and the underlying absorption layer 10, the type III-V semiconductor materials that provide the emitter layer 20 may be doped to a p-type or n-type conductivity, and the type IV semiconductor material that provide the absorption layer 10 may be doped to an opposite conductivity type as the emitter layer 20. For example, when the type III-V semiconductor material that provides the emitter layer 20 is doped to a p-type conductivity, the type IV semiconductor material that provides the absorption layer 10 is doped to an n-type conductivity. In another example, when the type III-V semiconductor material that provides the emitter layer 20 is doped to an n-type conductivity, the type IV semiconductor material that provides the absorption layer 10 is doped to a p-type conductivity.

For the type III-V semiconductor material that provides the emitter layer 20, the effect of the dopant atom, i.e., whether it is a p-type or n-type dopant, depends upon the site occupied by the dopant atom on the lattice of the base material. In a type III-V semiconductor, atoms from group II act as acceptors, i.e., p-type, when occupying the site of a group III atom, while atoms in group VI act as donors, i.e., n-type, when they replace atoms from group V. Dopant atoms from group IV, such as silicon (Si), have the property that they can act as acceptors or donor depending on whether they occupy the site of group III or group V atoms respectively. Such impurities are known as amphoteric impurities. The dopant concentration for the dopant that dictates the conductivity type of the type III-V semiconductor material that provides the emitter layer 20 may range from $10^{15}$ atoms/cm$^3$ to $10^{21}$ atoms/cm$^3$. In another embodiment, the dopant concentration that dictates the conductivity type of the type III-V semiconductor material ranges from $10^{16}$ atoms/cm$^3$ to $10^{20}$ atoms/cm$^3$.

Referring to FIG. 1, in some embodiments, a buffer/passivation layer 15 of a type III-V semiconductor material may be present between the emitter layer 20 and the absorption layer 10. The buffer layer/passivation layer 15 may be an intrinsic or lightly doped semiconductor material. In one embodiment, the buffer/passivation layer 15 may serve to improve the surface passivation of the type IV semiconductor material that provides the absorption layer 10 due to lower doping in layer buffer/passivation layer 15 compared to that the doping concentration in the emitter layer 20. In another embodiment, the buffer/passivation layer 15 may be comprised of a material having a lower lattice mismatch with the type IV semiconductor material of the absorption layer 10 compared to the lattice mismatch between the type III-V semiconductor material of the emitter layer 20 and the type IV semiconductor material of the absorption layer 10. By reducing the lattice mismatch between the material layers, the buffer/passivation layer 15 may reduce the generation of short range strain gradients during epitaxial growth. An "intrinsic semiconductor material" (also called an undoped semiconductor) or i-type semiconductor, is a substantially pure semiconductor without any significant dopant species present. The number of charge carriers in the intrinsic semiconductor is determined by the properties of the material itself instead of the amount of impurities, i.e., dopants. Typically, in intrinsic semiconductors the number of excited electrons and the number of holes are equal (n=p). In some embodiments, the buffer/passivation layer 15 may have a maximum dopant concentration for p-type or n-type dopant that is no greater than $10^{17}$ atoms/cm$^3$. The buffer/passivation layer 15 may be intentionally or unintentionally doped. Unintentional doping may arise from the diffusion of type IV semiconductor material atoms and/or dopant atoms from the absorption layer 10 into the buffer/passivation layer 15 during the epitaxial growth of the buffer/passivation layer 15, and/or subsequently, i.e., when the emitter layer 20. The buffer/passivation layer 15 may also be unintentionally doped during subsequent growth process steps. The dopants may also diffuse from emitter layer 20 into the buffer/passivation layer 15. In one embodiment, the buffer/passivation layer 15 is substantially free of n-type or p-type dopants. The buffer/passivation layer 15 may be composed of any of the type III-V semiconductor materials that have been described above with reference to the emitter layer 20. In some embodiments, the buffer layer/passivation layer 15 may be composed of the same composition as the type III-V semiconductor material that provides the emitter layer 20. The buffer/passivation layer 15 may be in direct contact with a surface of the type IV semiconductor material that provides the absorption layer 10. The buffer/passivation layer 15 may be formed by epitaxial growth. The thickness of the buffer/passivation layer 15 is thinner than 30 nm. In another embodiment, the thickness of the buffer/passivation layer 15 may range from 3 nm to 10 nm. The buffer/passivation layer 15 depicted in FIG. 1 is an optional layer and may be omitted. In the embodiments in which the buffer/passivation layer 15 is omitted, the type III-V semiconductor material that provides the emitter layer 20 may be in direct contact with the type IV semiconductor material that provides the absorption layer 10. Each of the aforementioned advantages described above for the buffer layer/passivation layer 15 may be provided singularly or in combination in the structures disclosed herein.

Type IV semiconductor materials that may provide the absorption layer 10 include silicon (Si), germanium (Ge), silicon germanium (SiGe), and silicon doped with carbon (Si:C). In one example, the type IV semiconductor material that provides the absorption layer 10 is silicon. The absorption layer 10 is usually a crystalline semiconductor material, such as a single crystalline or multi-crystalline semiconductor. It is noted that the aforementioned type IV semiconductor materials for the absorption layer 10 are provided for illustrative purposes only, as other type III-V semiconductor material can also be employed, so long as the electron affinity of the III-V semiconductor material is lower than that of the IV semiconductor material, and/or the hole affinity of the III-V material is higher than that of the IV semiconductor material.

The absorption layer 10 is typically formed from a semiconductor substrate and typically has a conductivity type that is opposite the conductivity type of the emitter layer 20. For example, when the emitter layer 20 is doped to a p-type conductivity, the absorption layer 10 is doped to an n-type conductivity, and when the emitter layer 20 is doped to an n-type conductivity, the absorption layer 10 is doped to a p-type conductivity. In an absorption layer 10 that is composed of a type IV semiconductor material examples of p-type dopants, i.e., impurities, include but are not limited to boron, aluminum, gallium, indium and combinations thereof. In one embodiment, in which the absorption layer 10 is doped to a p-type conductivity, the p-type dopant is present in a concentration ranging from $1\times10^9$ atoms/cm$^3$ to $1\times10^{20}$ atoms/cm$^3$. In another embodiment, in which the absorption layer 10 is doped to a p-type conductivity, the p-type dopant is present in a concentration ranging from $1\times10^{14}$ atoms/cm$^3$ to $1\times10^{18}$ atoms/cm$^3$. In an absorption layer 10 that is composed of a type IV semiconductor material, examples of n-type dopants, i.e., impurities, include but are not limited to, antimony, arsenic, phosphorous and combinations thereof. In one embodiment, in which the first conductivity type of the crystalline semiconductor material of the absorption layer 10 is n-type, the n-type dopant is present in a concentration ranging from $1\times10^9$ atoms/cm$^3$ to $1\times10^{20}$ atoms/cm$^3$. In another embodiment, in which the first conductivity type is n-type, the n-type dopant is present in a concentration ranging from $1\times10^{14}$ atoms/cm$^3$ to $1\times10^8$.

The surface $S_1$ of the absorption layer 10 that is in direct contact with the optional buffer/passivation layer 15, or is in direct contact with the emitter layer 20 when the optional buffer layer/passivation 15 is omitted, is typically textured. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled surface will typically be deflected to propagate through the device at an oblique angle, thereby increasing the length of the path taken to reach the device's back surface, as well as making it more likely that photons reflected from the device's back surface will impinge on the front surface at angles compatible with total internal reflection and light trapping. In some embodiments, the texture of the surface S of the absorption layer 10 provides a (111) crystal orientation. In some embodiments, the absorption layer 10 is Si (100) and textured to provide a (111) surface orientation. The absorption layer 10 may have a thickness T3 ranging from 100 nm to 1 mm. In one embodiment, the absorption layer 10 has a thickness T3 ranging from 500 nm to 0.5 mm. In another embodiment, the absorption layer 10 has a thickness T3 ranging from 50 microns to 180 microns.

Still referring to FIG. 1, the photovoltaic device may further include a first passivation layer 25 in direct contact with the emitter layer 20, and a second passivation layer 5 in direct contact with the absorption layer 10. The first passivation layer 25 and the second passivation layer 5 may each be composed of an intrinsic amorphous semiconductor material. The first passivation layer 25 can serve to passivate the upper surface of the emitter layer 20, and the second passivation layer 5 can serve to passivated the back surface of the absorption layer 10, wherein each of the first passivation layer 25 and the second passivation layer 5 can reduce electron-hole recombination. The thickness T4 of the first passivation layer 25 is typically smaller than 25 nm, although greater thicknesses can also be employed. In one embodiment, the thickness of the T4 of the passivation layer 25 is in the range of 3 nm to 8 nm. In some embodiments, the passivation layer 25 is comprised of hydrogenated amorphous Si and may contain C, Ge, O, N, F, D and combinations thereof. The thickness T5 of the second passivation layer 5 is typically smaller than 1 micron, although greater thicknesses can also be employed. In one embodiment, the thickness T5 of the passivation layer 5 is in the range of 50 nm to 150 nm. In another embodiment, the thickness T5 of the passivation layer 5 is in the range of 3 nm to 15 nm. The first and second passivation layers 25, 5 are optional, and may be omitted.

A transparent conductive material layer 30 may be present on the first passivation layer 25. Throughout this disclosure an element is "transparent" if the element is sufficiently transparent in the visible electromagnetic spectral range. In one embodiment, the transparent conductive material layer 30 can include a transparent conductive oxide such as, but not limited to, a fluorine-doped tin oxide ($SnO_2$:F), an aluminum-doped zinc oxide (ZnO:Al), tin oxide (SnO) and indium tin oxide ($InSnO_2$, or ITO for short). The thickness of the transparent conductive material layer 30 may vary depending on the type of transparent conductive material employed, as well as the technique that was used in forming the transparent conductive material. Typically, and in one embodiment, the thickness of the transparent conductive material layer 30 ranges from 20 nm to 500 nm. Other thicknesses, including those less than 20 nm and/or greater than 500 nm can also be employed. The transparent conductive material layer 30 is optional, and may be omitted.

A front contact 35 (also referred to as an emitter contact 35) is in direct contact with the transparent conductive material layer 30, and a back contact (not shown) is in electrical communication with the absorption layer 10. In one embodiment, the front contact 35 of the solar cell consists of a set of parallel narrow finger lines and wide collector lines deposited typically at a right angle to the finger lines. The front contact 35 is typically composed of a metallic material. The metallic material that provides the front contact 35 may be any conductive paste, such as aluminum (Al) paste, silver (Ag) paste, copper (Cu) paste, or aluminum silver (AlAg) paste. The thickness of the front contact 35 can range from 100 nm to 10 micrometers, although lesser and greater thicknesses can also be employed. Similar to the front contact 35, the back contact 40 may be composed of any conductive material, such as aluminum, and may have a thickness ranging from 100 nm to 10 micrometers, although lesser and greater thicknesses can also be employed.

Figure 2:
FIG. 2 is a side cross-sectional view of an initial structure that may be utilized to form a single junction solar cell similar to that depicted in FIG. 1, wherein the initial structure includes a substrate of a type IV semiconductor material that provides the absorption layer of the single junction solar cell, in accordance with one embodiment of the present disclosure.
Figure 3:
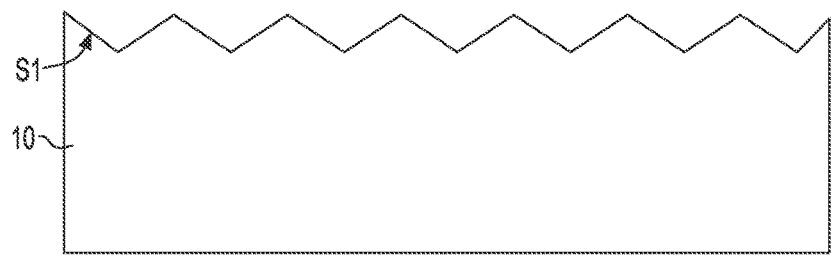
FIG. 3 is a side cross-sectional view depicting texturing the substrate of the type IV semiconductor material, in accordance with one embodiment of the present disclosure.
Figure 4:
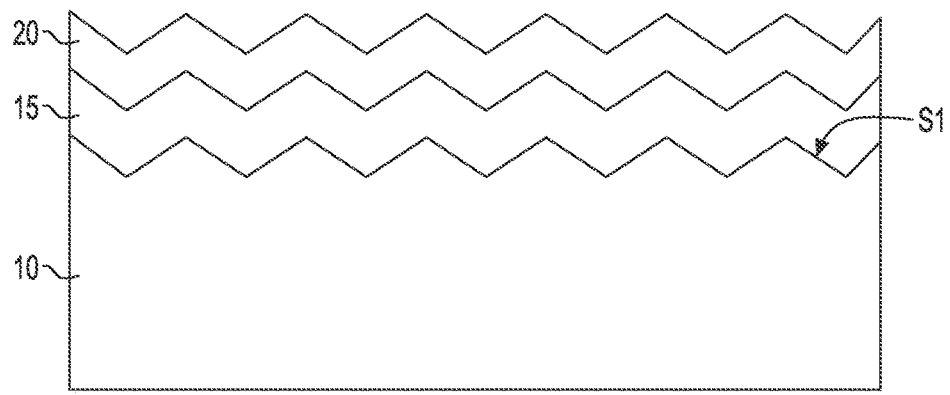
FIG. 4 is a side cross-sectional view depicting epitaxially forming a type III-V semiconductor material on the textured surface of the substrate of the type IV semiconductor material, wherein at least a portion of the type III-V semiconductor material provides the emitter layer of the single junction solar cell, in accordance with one embodiment of the present disclosure.

FIGS. 2-4 depict one embodiment of a method of forming the single junction solar cell that provides the photovoltaic device depicted in FIG. 1. In one embodiment, the present disclosure provides a method of forming a photovoltaic device 100 that includes providing an absorption layer 10 of a crystalline type IV semiconductor material having a first conductivity type, and epitaxially forming an emitter layer 20 of a crystalline type III-V semiconductor material having a second conductivity type positioned on a surface of the absorption layer 10. The terms "first conductivity type" and "second conductivity type" mean that the emitter layer 20 and the absorption layer 10 have opposite conductivity types. For example, when the emitter layer 20 is doped to a p-type conductivity type, the absorption layer 10 is doped to an n-type conductivity, and when the emitter layer 20 is doped to an n-type conductivity, the absorption layer 10 is doped to a p-type conductivity.

FIG. 2 depicts one embodiment of an initial structure that may be utilized to form a single junction solar cell similar to that depicted in FIG. 1, wherein the initial structure includes a substrate of a type IV semiconductor material that provides the absorption layer 10 of the single junction solar cell. Suitable compositions and thicknesses for the type IV semiconductor material of the substrate that provides the absorption layer 10 have been described above with reference to FIG. 1. In one example, the substrate is composed of single crystal silicon. The dopant that provides the first conductivity type of the absorption layer 10 may be introduced to the substrate using ion implantation, gas phase doping, or may be introduced to the substrate by in-situ doping during the substrate formation process. In some embodiments, the substrate that provides the absorption layer 10 contains Si and has a (100) crystal orientation.

FIG. 3 depicts one embodiment of texturing the substrate of the type IV semiconductor material. In one embodiment, texturing the substrate provides a textured surface S1 having a (111) crystalline orientation. In one embodiment, texturing a single crystal substrate of type IV semiconductor material can be performed by etching the upper surface of the type IV semiconductor material with a potassium hydroxide (KOH) based solution. In another embodiment, texturing a multi-crystalline substrate of type IV semiconductor material can be performed by etching the upper surface of the type IV semiconductor material with a nitric acid ($HNO_3$)/hydrofluoric acid (HF) solution. Other solutions suitable for texturing the substrate include potassium carbonate ($K_2CO_3$). In yet another embodiment, texturing can be achieved by utilizing a combination of reactive ion etching (RIE) and a mask comprising closely packed self-assembled polymer spheres. In an even further embodiment, texturing can be achieved using reactive ion etching (RIE) without an etch mask. In some embodiments, both sides of the absorption layer 10 are textured. In some embodiments, the textured backside of the absorption layer 10 improves the reflection of light from the backside of the absorption layer 10 back into the absorption layer 10.

FIG. 4 depicts one embodiment of epitaxially forming a type III-V semiconductor material as a buffer/passivation layer 15 positioned on the textured surface S1 of the substrate of the type IV semiconductor material that provides the absorption layer 10, wherein at least a portion of the type III-V semiconductor material provides the emitter layer 20 of the single junction solar cell. When the chemical reactants are controlled and the system parameters set correctly, the epitaxially depositing atoms arrive at the surface of the textured surface S1 of the absorption layer 10 with sufficient energy to move around on the surface and orient themselves to the crystal arrangement of the atoms of the deposition surface.

A number of different sources may be used for the deposition of epitaxial type III-V semiconductor material. In some embodiments, the sources for epitaxial growth of type III-V semiconductor material include solid sources containing indium (In), gallium (Ga), nitrogen (N), phosphorus (P) elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. Other growth techniques such as liquid phase epitaxy from liquid sources, or gas phase epitaxy from gas sources, may also be used. The temperature for epitaxial growth of type III-V semiconductor materials typically ranges from 450° C. to 900° C., although lower or higher temperatures may also be employed. The growth temperature may also depend on the growth technique. For instance, in molecular beam epitaxy (MBE) from solid sources, the substrate temperature may be as low as 200° C. In the growth of N or P based materials by molecular beam epitaxy (MBE), the low substrate temperatures may be facilitated by plasma assisted cracking of gas sources such as $NH_3$ or $PH_3$ to provide N and P atoms, respectively. In the case of epitaxial growth by metal organic chemical vapor deposition (MOCVD), higher temperatures typically results in faster deposition, but the faster deposition may result in crystal defects and film cracking.

In some embodiments, the buffer/passivation layer 15 is deposited directly on the textured surface S1 of the absorption layer 10. The composition and thickness of the buffer/passivation layer 15 has been described above with reference to FIG. 1. In some embodiments, buffer/passivation layer 15 is formed by epitaxial growth. As described above, the buffer/passivation layer 15 is an intrinsic semiconductor layer, or a lightly doped semiconductor layer. When the buffer/passivation layer 15 is lightly doped, the maximum n-type or p-type dopant concentration that is present in the buffer/passivation layer 15 may be $10^{17}$ atoms/$cm^3$. The buffer/passivation layer 15 is optional, and may be omitted.

Still referring to FIG. 4, the emitter layer 20 may be epitaxially deposited to be positioned on the absorption layer 10, in which the emitter layer 20 is doped to an opposite conductivity type as the absorption layer 10. In the embodiments in which the buffer/passivation layer 15 is present on the absorption layer 10, the emitter layer 20 may be epitaxially grown in direct contact with the top surface of the buffer layer 15 that is opposite the surface of the buffer/passivation layer 15 that is in direct contact with the textured surface S1 of the absorption layer 10. In the embodiments in which the buffer/passivation layer 15 is present, the emitter layer 20 may be composed of a type III-V semiconductor material having a different composition as the buffer/passivation layer 15. In the embodiments when the buffer/passivation layer 15 is omitted, the emitter layer 20 may be epitaxially grown in direct contact with the textured surface S1 of the absorption layer 10.

The emitter layer 20 may be doped with an in-situ doping process or may be doped following deposition of the material layer for the emitter layer 20 using at least one of plasma doping, ion implantation, and/or outdiffusion from a disposable diffusion source (e.g., borosilicate glass). By in-situ it is meant that the dopant that provides the conductivity type of the material layer, e.g., emitter layer 20, is introduced as the material layer is being formed or deposited. In one embodiment, in which the emitter layer 20 is in-situ doped to provide a p-type or n-type conductivity, the dopant gas may be selected from the group consisting of bis-cyclopentadienyl-magnesium ($Cp_2Mg$), silane ($SiH_4$), disilane ($Si_2H_6$), germane ($GeH_4$), carbon tetrabromide ($CBr_4$) and combinations thereof.

Referring to FIG. 1, following the formation of the single junction solar cell, the first and second passivation layers 25, 5 are formed utilizing a physical vapor deposition (PVD), chemical vapor deposition (CVD), or thermal and/or plasma assisted oxidation/nitridation processes. In some embodiments where the first and second passivation layers 25, 5 are composed of intrinsic amorphous hydrogenated semiconductor material, e.g., silicon, the intrinsic amorphous hydrogenated semiconductor material is deposited in a process chamber containing a semiconductor precursor source gas and a carrier gas including hydrogen. Hydrogen atoms in the hydrogen gas within the carrier gas are incorporated into the deposited material to form the intrinsic hydrogenated semiconductor material that provides the first and second passivation layers 25, 5. In some embodiments, the second passivation layer 5 may be formed prior to the formation of the emitter layer 20. In the embodiments in which the second passivation layer 5 is formed by thermal oxidation of the absorption layer 10 (i.e. the starting substrate) prior to the formation of the emitter layer 20, the thermal oxide formed on the top surface of the absorption layer 10 may be removed (locally or entirely) for example by wet etching prior to emitter layer 10 formation in order to provide at least a portion of the top surface of layer 10 for the growth of the emitter layer and/or buffer layers. The transparent conductive material layer 30 is typically formed using a deposition process, such as sputtering or chemical vapor deposition (CVD). The front contact 35 may be formed with a screen printing technique. In another embodiment, the front contact 35 is provided by the application of an etched or electroformed metal pattern. The back contact (not depicted) may be formed using similar methods as the front contact 35.

Figure 5:
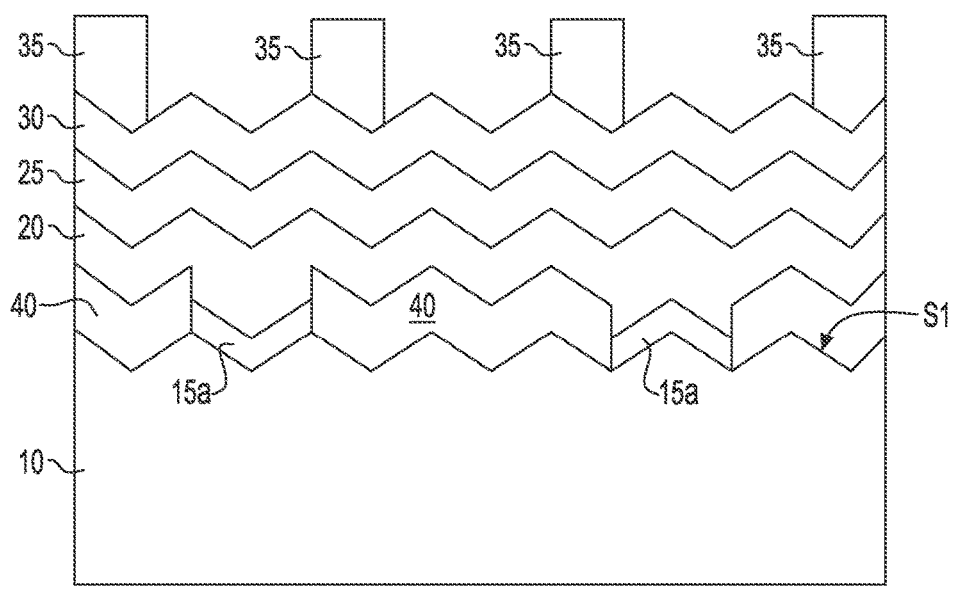
FIG. 5 is a side cross-sectional view that depicts another embodiment of the present disclosure in which the passivation layer atop the absorption layer is patterned prior to the epitaxial growth of the III-V emitter layer, in accordance with the present disclosure.
Figure 6:
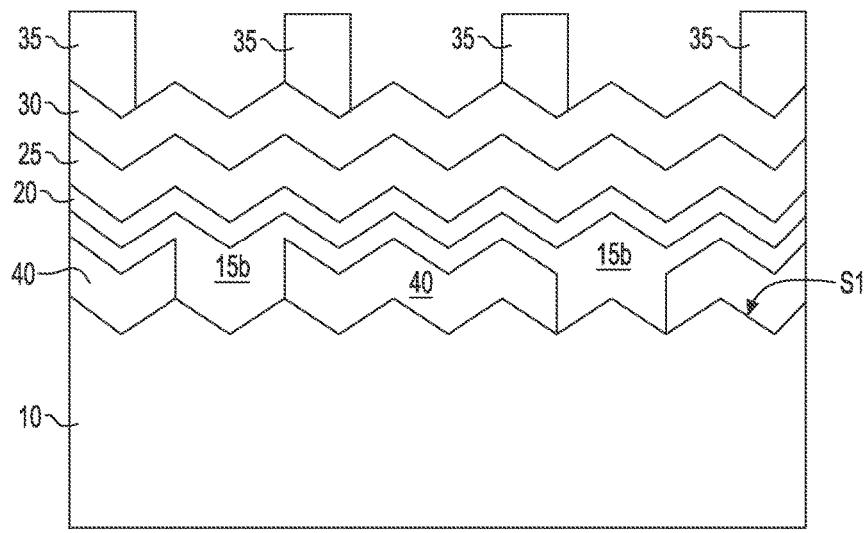
FIG. 6 is a side cross-sectional view depicting lateral epitaxial growth of the III-V semi conductor of the emitter layer atop the patterned passivation layer, in accordance with one embodiment of the present disclosure.

FIG. 5 depicts another embodiment of the present disclosure, in which a patterned passivation layer 40 is formed atop the absorption layer 10 prior to forming the emitter layer 20 of epitaxially grown type III-V semiconductor material. In this embodiment, the epitaxially grown type III-V semiconductor material that provides the emitter layer 20 can be is in direct contact with the absorption layer 10, and is present in the openings through the patterned passivation layer 40. In some embodiments in which the absorption layer 10 is comprised of silicon, the patterned buffer/passivation layer 40 is comprised of silicon dioxide ($SiO_2$), which may be formed by thermal oxidation and patterned using lithography or laser removal processes. In some embodiments where the patterned buffer/passivation layer 40 does not provide a surface suitable for the epitaxial growth of III-V materials, epitaxial growth of III-V materials is initiated on the surface of the absorption layer 10 (i.e., locations where the layer 40 has been removed), followed by lateral epitaxial growth on top of the patterned passivation layer 40. An optional buffer/passivation layer 15a may be formed on top of absorption layer 10 prior to the formation of the emitter layer 20. Referring to FIG. 6, in some embodiments, lateral epitaxial growth of the buffer/passivation layer 15b may occur prior to the lateral epitaxial growth of the emitter layer 20. The embodiments depicted in FIGS. 5 and 6 include a process flow that may precede the formation of the second passivation layer 5.

Figure 7:
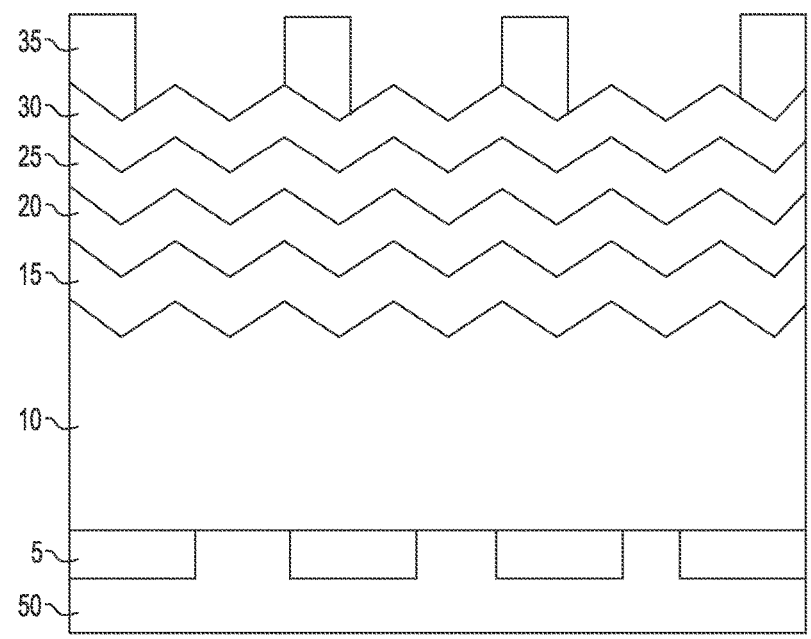
FIG. 7 is a side cross-sectional view depicting forming a back contact to the absorption layer, in accordance with one embodiment of the present disclosure.

Referring to FIG. 7, in some embodiments, the second passivation layer 5 may be patterned using techniques such as lithography or laser removal prior to the formation of the back contact 50. In these embodiments, the back contact 50, which is typically composed of a metal, is in direct contact with the absorption layer 10 at the regions where the second passivation layer 5 has been removed. In these embodiments, the back contact 50 is typically referred to as a localized back contact.

Figure 8:
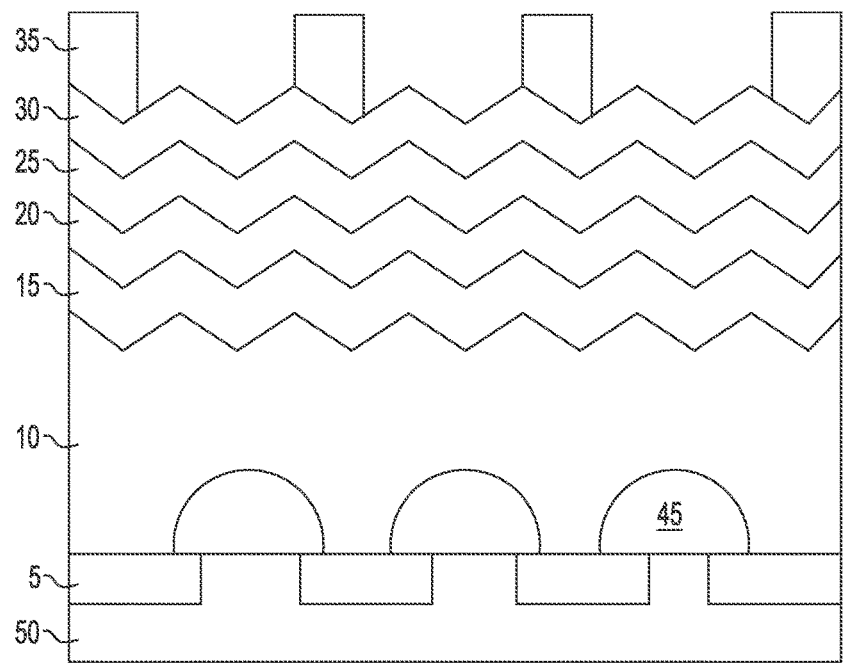
FIG. 8 is a side cross-sectional view depicting forming a localized back surface field region in the absorption layer, in accordance with one embodiment of the present disclosure.

Referring to FIG. 8, in some embodiments, in which the second passivation layer 5 has been patterned, as described with reference to FIG. 7, doped regions 45 may be formed in the absorption layer 10. The doped regions 45 may be formed at areas where the second passivation layer 5 has been removed. The doped regions 45 may be formed by ion implantation or gas phase doping. In some embodiments, the doped regions 45 typically have the same conductivity, i.e., p-type or n-type conductivity, as the dopant that is present in the absorption layer 10. The doped regions 45 depicted in FIG. 8 may be referred to as localized back surface field contacts.

Figure 9:
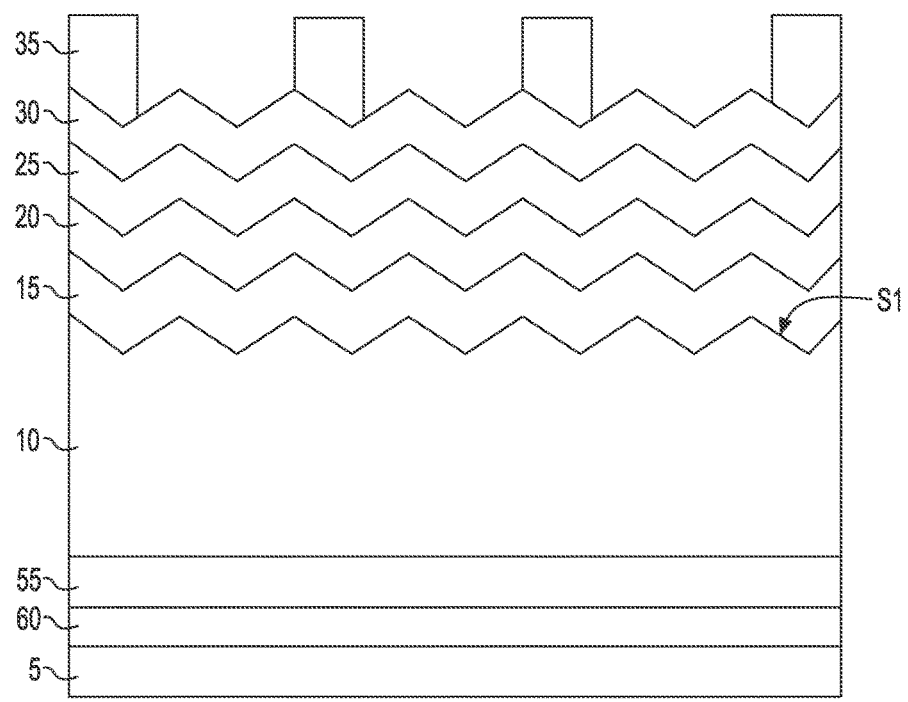
FIG. 9 is a side cross-sectional view depicting forming one or more material layers between the absorption layer and the passivation layer that is present proximate to the absorption layer's back surface, in accordance with one embodiment of the present disclosure.

Referring to FIG. 9, in some embodiments, one or more doped material layers 55 may be present between the second passivation layer 5 and the back contact 50. The one or more doped material layers 55 may be composed of hydrogenated amorphous silicon, hydrogenated nano-crystalline silicon, hydrogenated micro-crystalline silicon, poly-crystalline Si, hydrogenated amorphous germanium (a-Ge:H), hydrogenated nano-crystalline germanium, hydrogenated micro-crystalline germanium, poly-crystalline germanium, and combinations thereof, and may contain a dopant selected from carbon (C), nitrogen (N), oxygen (O), fluorine (F), deuterium (D) and combinations thereof. Still referring to FIG. 9, in some embodiments, a transparent conductive material 60, such as a transparent conductive oxide, e.g., fluorine-doped tin oxide ($SnO_2$:F), may be present between the one or more doped material layers 55 and the back contact 50.

Figure 10:
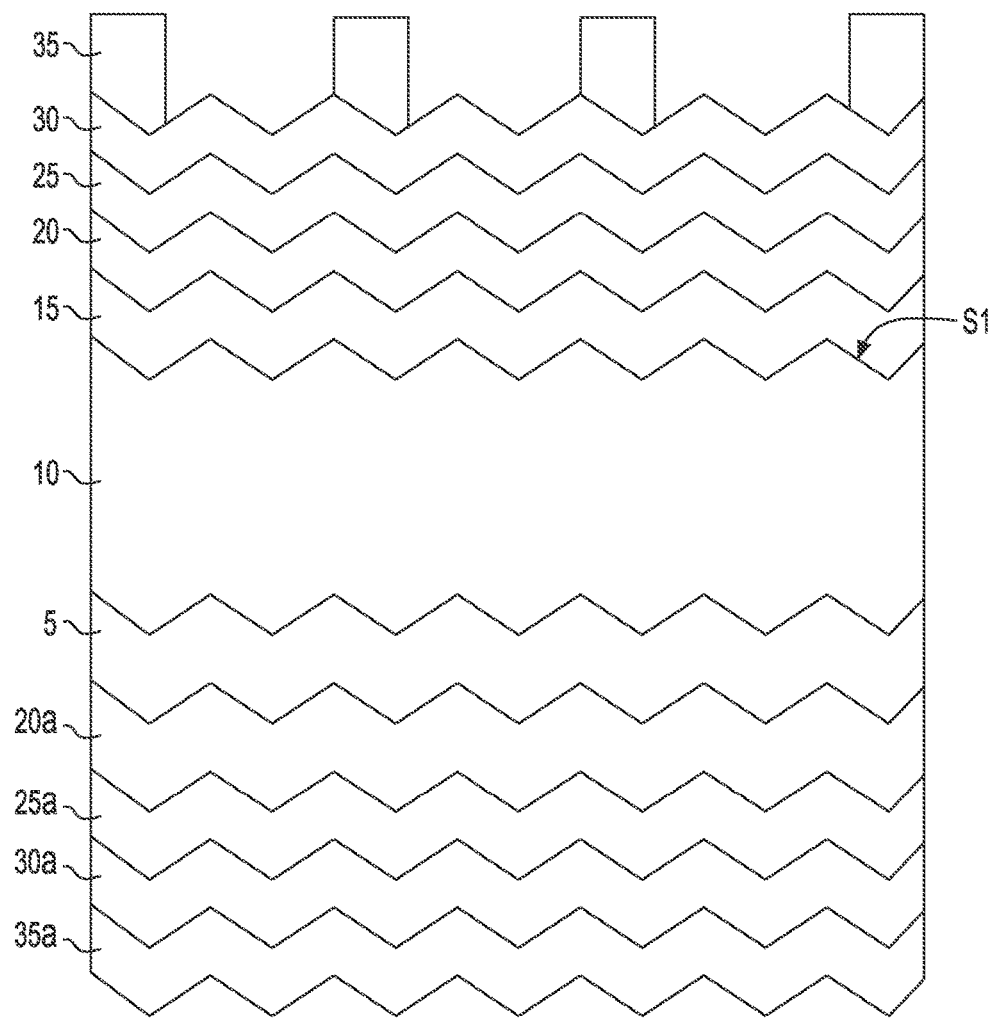
FIG. 10 is a side cross-sectional view depicting a single junction solar cell in which the material layers atop the absorption layer are similar to the material layers under the absorption layer, in accordance with one embodiment of the present disclosure.

Referring to FIG. 10, in some embodiments, the backside contact structure may have the same configuration as that of the front side (emitter) contact structure, but with the doped layers 20a having the same conductivity type as that of the absorption layer 10. The composition of the corresponding layers in the front and back of the absorption layer 10 may be different. Also, an optional layer may be present on one side, while the corresponding optional layer may not be present on the other side. If the absorption layer 10 is p-type, the III-V material of the backsurface-field layer 20a is chosen to have a hole affinity larger than that of the absorption layer 10. Similarly, if the absorption layer 10 is n-type, the III-V material of the back-surface-field layer 20a is chosen to have an electron affinity lower than that of the absorption layer 10. The function of the optional passivation layer 25a is the same as that of first passivation layer 25. The transparent conductive material layer 30a is optional and may be omitted. The back contact layer 35a may be a metal grid or a blanket metal layer.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A method of forming a photovoltaic device, said method comprising:
    providing an absorption layer of a crystalline type IV semiconductor material having a first conductivity type; and
    epitaxially forming an emitter layer of a crystalline type III-V semiconductor material having a second conductivity type on a surface of the absorption layer, wherein the emitter layer has a thickness of 50 nm or less such that a majority of photo-generated charge carriers tunnel, rather than diffuse, through the emitter layer.

2. The method of claim 1, wherein the absorption layer is provided by a silicon-containing substrate.

3. The method of claim 2, wherein a surface of the silicon-containing substrate is textured to provide a (111) crystal surface.

4. The method of claim 2, further comprising texturing a surface of the silicon-containing substrate.

5. The method of claim 4, wherein the texturing comprises treating the surface of the silicon-containing substrate with a wet etch comprised of at least one of potassium hydroxide (KOH), potassium carbonate ($K_2CO_3$), nitric acid ($HNO_3$), hydrofluoric acid (HF) or a combination thereof.

6. The method of claim 4, wherein the texturing comprises a reactive ion etch (RIE).

7. The method of claim 1, wherein prior to forming the emitter layer, a buffer layer of type III-V semiconductor material is epitaxially deposited.

8. The method of claim 1, wherein the second conductivity of the emitter layer is an opposite conductivity as compared with the first conductivity of the absorption layer.

9. The method of claim 8, wherein a second dopant that provides the second conductivity of the emitter layer is introduced to the crystalline type III-V semiconductor material in-situ during epitaxial growth of the crystalline type III-V semiconductor material that provides the emitter layer.

10. The method of claim 9, wherein the second dopant is provided by a dopant gas selected from the group consisting of bis-cyclopentadienyl-magnesium ($Cp_2Mg$), silane ($SiH_4$), disilane ($Si_2H_6$), germane ($GeH_4$), carbon tetrabromide ($CBr_4$) and combinations thereof.

11. The method of claim 1, wherein the crystalline type III-V semiconductor material has a defect density that ranges from $10^{13}$ defects/cm$^3$ to $10^{19}$ defects/cm$^3$.

12. The method of claim 1, wherein the first conductivity type is p-type and the second conductivity type is n-type.

13. The method of claim 1, wherein the first conductivity type is n-type and the second conductivity type is p-type.

14. The method of claim 1, further comprising forming a passivation layer on a surface of the absorption layer that is opposite to a textured surface of the absorption layer.

15. The method of claim 14, further comprising forming a back contact on an exposed surface of the passivation layer, wherein the back contact is formed subsequent to a patterning of the passivation layer.

16. The method of claim 14, further comprising forming a doped region within an exposed surface of the absorption layer, wherein the doped region is formed subsequent to the patterning of the passivation layer.

17. The method of claim 1, further comprising forming a doped material layer or a transparent conductive material on a surface of the absorption layer that is opposite to a textured surface of the absorption layer, wherein the doped material layer or the transparent conductive material are formed prior to forming a back contact.

* * * * *